United States Patent
Fan

(10) Patent No.: US 6,377,472 B1
(45) Date of Patent: Apr. 23, 2002

(54) SHIELDING DEVICE

(75) Inventor: Chia-Hao Fan, Shu-Lin (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/602,651

(22) Filed: Jun. 22, 2000

(30) Foreign Application Priority Data

Apr. 18, 2000 (TW) ........................................ 089206318

(51) Int. Cl.⁷ .................................................. H05K 9/00
(52) U.S. Cl. ........................ 361/800; 361/801; 361/816; 361/818; 174/35 R
(58) Field of Search ................................. 361/752, 759, 361/800, 801, 816, 818; 174/35 R, 356 C

(56) References Cited

U.S. PATENT DOCUMENTS

| | | | | |
|---|---|---|---|---|
| 4,384,165 A | * | 5/1983 | Loving, Jr. et al. | ..... 174/35 GC |
| 5,175,395 A | * | 12/1992 | Moore | ....................... 174/35 R |
| 5,536,905 A | * | 7/1996 | Redman et al. | ......... 174/35 GC |
| 5,633,786 A | * | 5/1997 | Matuszewski et al. | ...... 361/818 |
| 5,895,884 A | * | 4/1999 | Davidson | ................... 174/35 R |

* cited by examiner

Primary Examiner—Jayprakash N. Gandhi
(74) Attorney, Agent, or Firm—Wei Te Chung

(57) ABSTRACT

A shielding device comprises a top cover and a frame. The top cover comprises a body portion with a plurality of holes being formed in the body portion. A plurality of flanges extends downward from outer edges of the body portion. A dome shaped projection is formed in a central portion of each flange. The frame comprises a narrow top wall and a side wall depending downward from outer edges of the top wall. An engaging portion in the form of an elongated groove depressed inwardly is formed in the side wall for detachably engaging with corresponding dome shaped projections to the top cover.

5 Claims, 4 Drawing Sheets

SHIELDING DEVICE

BACKGROUND OF THE INVENTION

The present invention relates to a shielding device, and particularly to a shielding device for providing EMI (electromagnetic interference) protection for electronic components on a circuit board.

Related inventions are disclosed in U.S. Pat. Nos. 5,400,949, 5,365,410 and 5,742,488. Generally, EMI shielding devices take the form of metal or metallised plastic covers designed to be placed over electronic components on a circuit board. To prevent the shielding devices from separating from the circuit board, the most common method of attaching the shields to the circuit board is by a soldering process. However, the process of de-soldering the shielding device from the circuit board to repair the electronic components beneath is very difficult.

Many detachable shielding devices are provided to solve this problem. Related inventions are disclosed in U.S. Pat. Nos. 5,252,782, 5,353,201, 5,419,722, 5,434,747, 5,436,399, 5,495,399, 5,660,558, 5,742,004, 5,014,160, 5,198,618 and 5,895,884.

Referring to FIG. 1, a conventional shielding device 5 comprises a cover 51 and a base frame 50. A plurality of flanges 511 depends from outer edges of the cover 51. The base frame 50 comprises side walls 500 and a plurality of apertures 501 defined in the side walls 500. Each flange 511 comprises an inwardly projecting dome shaped projection 512 for engaging with the apertures 501 when the shielding device 5 is in closed position. The press dies used to form the punched apertures 501 have a short life, which increases the cost of the shielding device 5. Furthermore, after assembly the dome shaped projections 512 lock too firmly with the corresponding apertures 501. Therefore, it is difficult to detach the cover 51 from the base frame 50. Finally, it is sometimes troublesome to precisely align the projections 512 with the apertures 501, resulting in an inconvenient assembly of the shielding device 5.

Thus there is a need for an improved shielding device which can overcome the disadvantage of the prior art.

BRIEF SUMMARY OF THE INVENTION

A main object of the present invention is to provide a shielding device for providing EMI (electromagnetic interference) shielding for electronic components on a circuit board.

Another object of the present invention is to provide a shielding device which is easily assembled/disassembled and which has a low manufacturing cost.

To fulfill the above-mentioned objects, according to a preferred embodiment of the present invention, a shielding device comprises a top cover and a frame. The top cover comprises a body portion with a plurality of holes being formed in the body portion. A plurality of flanges extends downward from outer edges of the body portion. A dome shaped projection is formed in a central portion of each flange. The frame comprises a narrow top wall and a side wall. An engaging portion in the form of an elongated groove depressed inwardly is formed in the side wall for detachably engaging with corresponding dome shaped projections. The top wall extends inwardly and horizontally from the top edge of the side wall. The side wall continues downwardly from the engaging portion for mounting on the circuit board. The engaging portion is formed with a concave outer surface for receiving corresponding projections of the top cover.

Other objects, advantages and novel features of the invention will become more apparent from the following detailed description when taken in conjunction with the accompanying drawings.

DETAILED DESCRIPTION OF THE INVENTION

Figure 1:
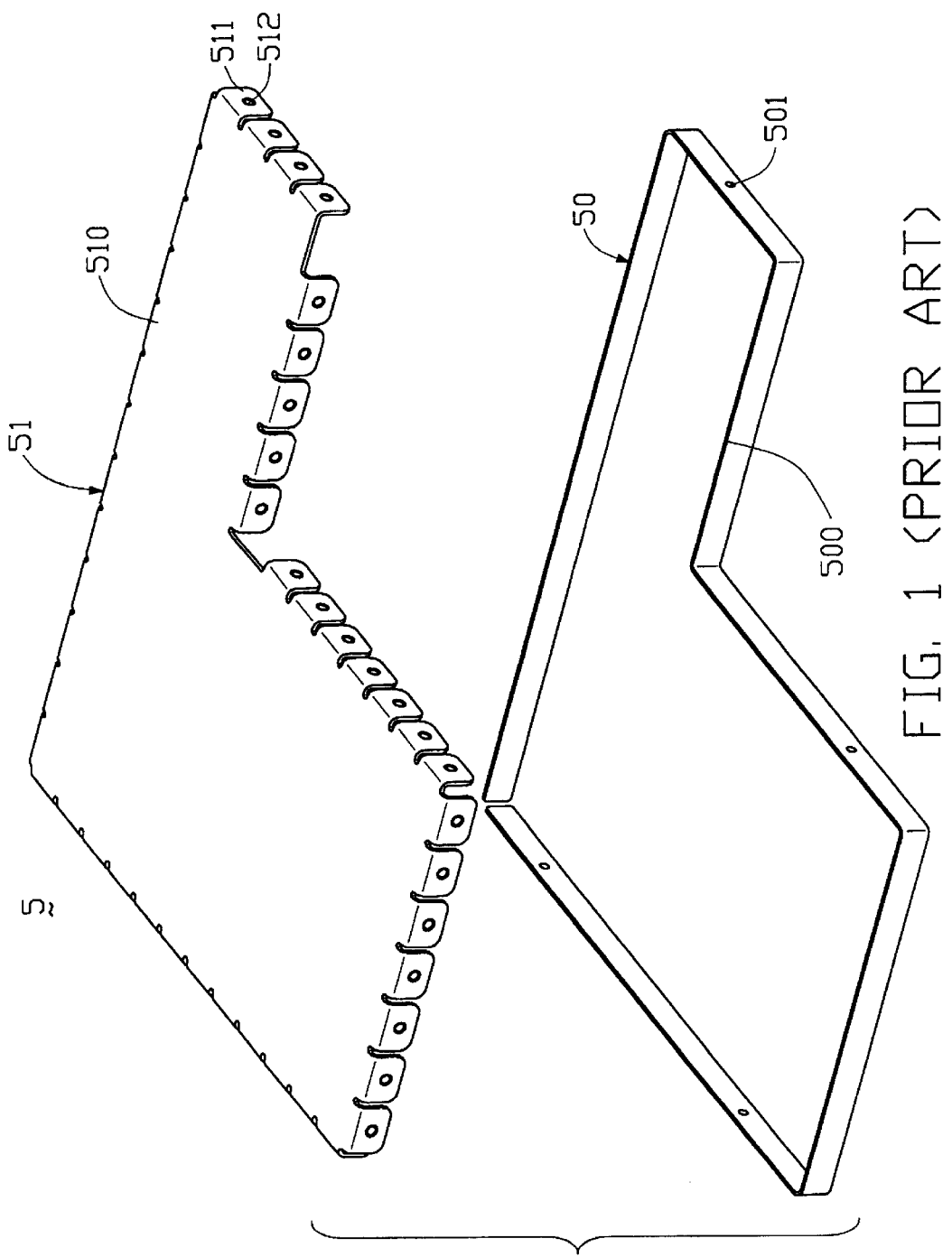
FIG. 1 is a perspective, exploded view of a conventional shielding device.
Figure 2:
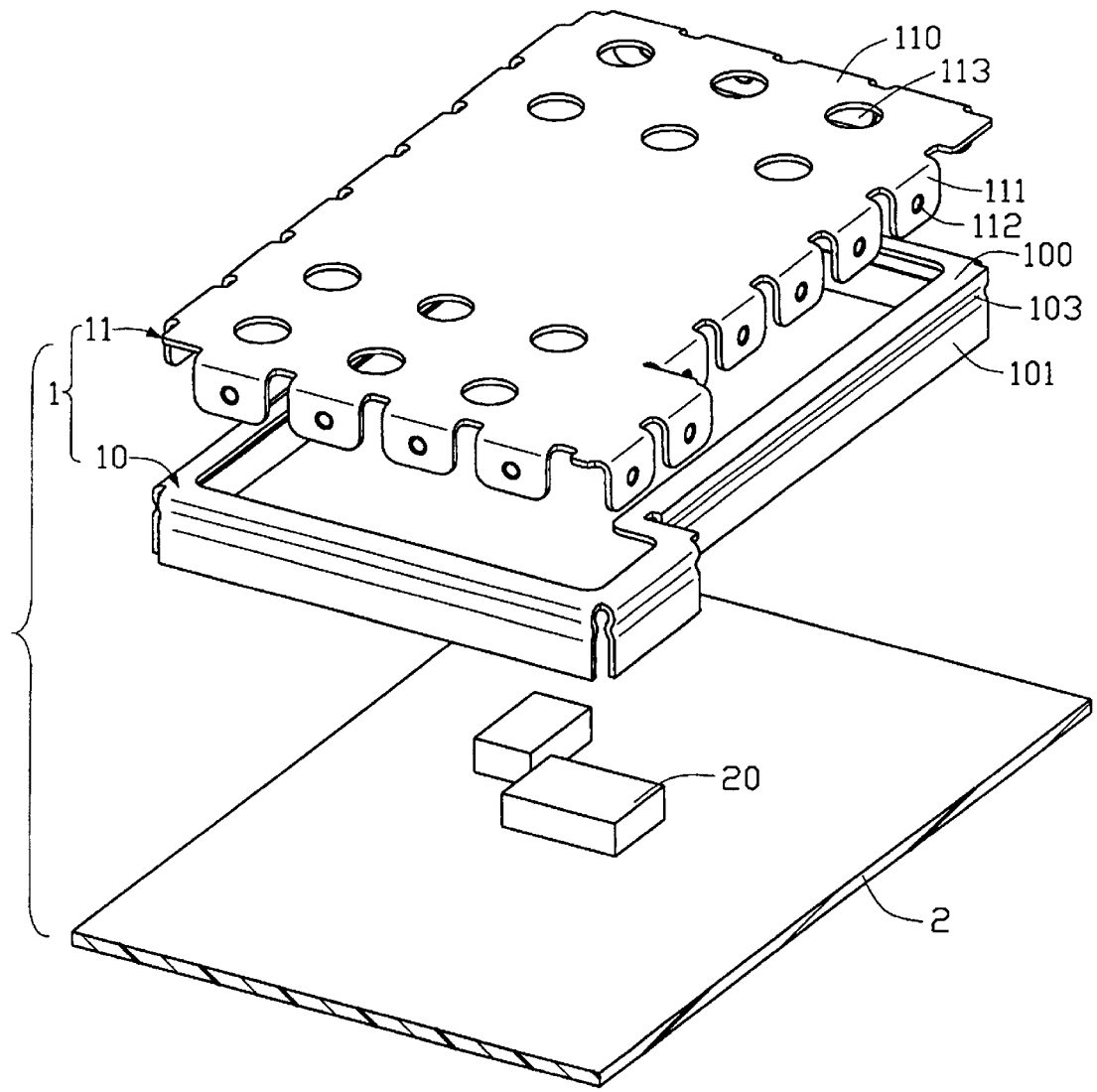
FIG. 2 is a perspective, exploded view of a shielding device in accordance with the present invention and a circuit board.
Figure 3:
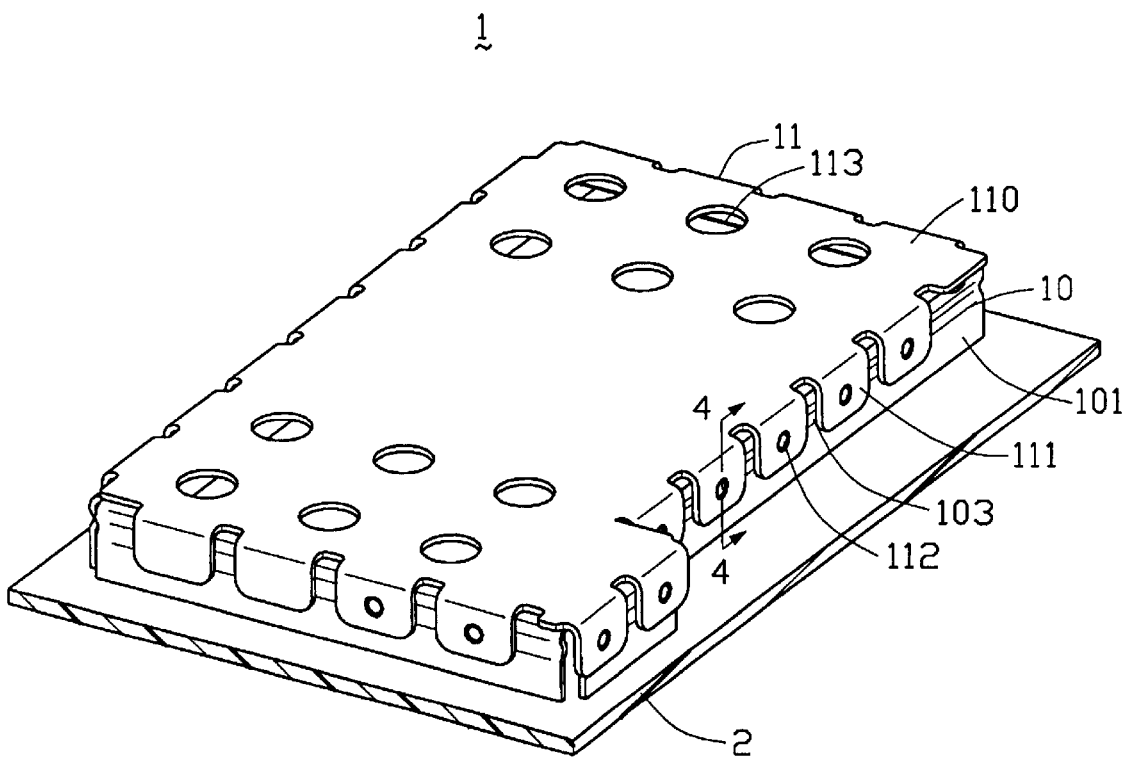
FIG. 3 is a perspective view of the assembled shielding device attached to the circuit board.
Figure 4:
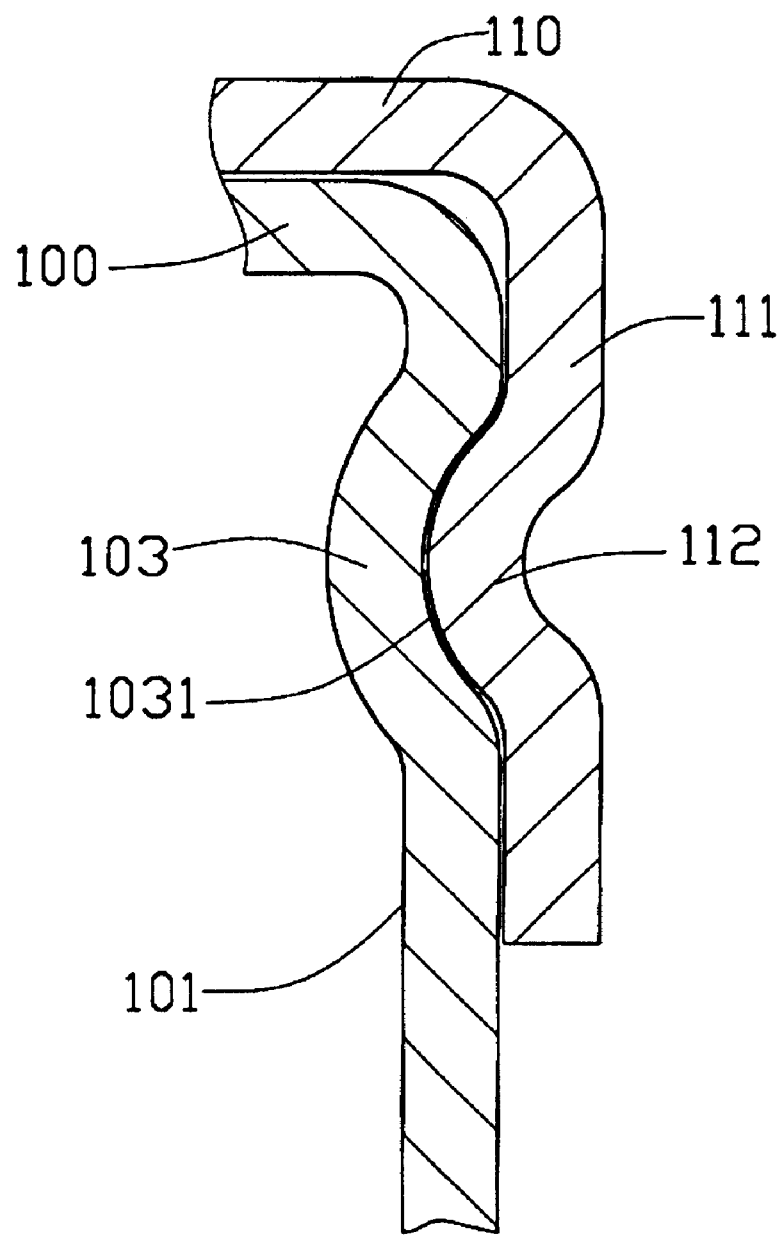
FIG. 4 is a cross-sectional view taken along line 4—4 of FIG. 3.

Referring to FIGS. 2–4, a shielding device 1 comprises a top cover 11 and a frame 10. The frame 10 is mounted on a circuit board 2 by soldering and encloses a plurality of electronic elements 20 on the circuit board 2 within its bound.

The top cover 11 is formed by stamping a metal plate. The top cover 11 comprises a body portion 110 and a plurality of holes 113 formed in the body portion 110. A plurality of flanges 111 extends from outer edges of the body portion 110. An inwardly projecting dome shaped projection 112 is formed in a central portion of each flange 111.

The frame 10 comprises a narrow, horizontal top wall 100 and a plurality of side walls 101 depending downwardly from outer edges of the top wall 100. The side walls 101 are separated from each other at junctions of the outer edges of the top wall 100. An engaging portion 103 in the form of an elongated continuous groove depressed inwardly is formed in each side wall 101 for detachably engaging with corresponding dome shaped projections 112. The side walls 101 continue downwardly from the engaging portions 103 for mounting on the circuit board 2. Each engaging portion 103 has a concave outer surface 1031 for receiving corresponding projections 112 of the top cover 11.

During assembly, the flanges 111 of the top cover 11 are brought to slide over the side wall 101 of the frame 10, and the dome shaped projections 112 easily encounter the engaging portion 103 and reliably lock therewith. Thus, the top cover 11 is assembled to the frame 10 to shield the electronic elements 20. During disassembly, the dome shaped projections 112 are easily detached from the concave surface 1031 of the engaging portion 103, so that the top cover 11 can be separated from frame 10, thereby facilitating repair of the electronic elements 20 when necessary.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shielding device for providing EMI shielding for electronic elements on a circuit board, comprising:

a top cover having a body portion and a plurality of flanges extending downward from outer edges of the body portion, each flange forming a projection thereon; and a frame mounted on the circuit board and enclosing the electronic elements, comprising a top wall having a plurality of edges and a plurality of side walls depending from the edges of the top wall, the side walls being separated from each other and each defining an elongated continuous groove extending from one end thereof to an opposite end thereof for engaging with the projections of the top cover, whereby the cover and the frame together shield the electronic elements.

2. The shielding device as claimed in claim 1, wherein each projection is dome shaped and is located in a central portion of a corresponding flange.

3. The shielding device as claimed in claim 1, wherein the groove has a concave outer surface extending parallel to the edge of the top wall for engaging with the projections.

4. The shielding device as claimed in claim 1, wherein the side wall of the frame downwardly extends from the engaging portion and has a bottom edge for mounting on the circuit board.

5. An electrical assembly comprising:

a printed circuit board having electronic elements thereon;

a conductive frame mounted on the printed circuit board and encircling said electronic elements, said frame having a circumferential side wall defining a horizontally extending groove therein; and a conductive cover defining a planar body portion with a plurality of flanges extending downwardly from the circumferential outer edges of the body portion corresponding to said side wall; wherein some of said flanges define inward projections along a horizontal direction, and said projections are received within the groove.

* * * * *